United States Patent [19]

Yamashita et al.

[11] Patent Number: 5,463,232

[45] Date of Patent: Oct. 31, 1995

[54] SOLID-STATE IMAGING DEVICE WITH INTERNAL SMEAR ELIMINATOR

[75] Inventors: Hirofumi Yamashita; Ikuko Inoue, both of Kawasaki; Michio Sasaki; Ryohei Miyagawa, both of Yokohama, all of Japan

[73] Assignee: Kabushiki Kaisha Toshiba, Kawasaki, Japan

[21] Appl. No.: 43,632

[22] Filed: Apr. 8, 1993

Related U.S. Application Data

[63] Continuation of Ser. No. 831,362, Feb. 5, 1992, abandoned.

[30] Foreign Application Priority Data

| Feb. 5, 1991 | [JP] | Japan | 3-014489 |
| Sep. 30, 1991 | [JP] | Japan | 3-278542 |

[51] Int. Cl.$^6$ .................. H01L 29/796; H01L 27/14; H01L 31/00
[52] U.S. Cl. .................. 257/223; 257/233; 257/435
[58] Field of Search .................. 357/24, 30; 377/57–63; 257/222, 223, 233, 435

[56] References Cited

U.S. PATENT DOCUMENTS

| 4,373,167 | 2/1983 | Yamada | 357/24 |
| 4,696,021 | 9/1987 | Kawahara et al. | 357/24 |
| 4,717,945 | 1/1988 | Yusa et al. | 357/24 |
| 4,814,848 | 3/1989 | Akimoto et al. | 357/24 |
| 4,982,252 | 1/1991 | Matsunga | 357/24 |
| 5,028,972 | 7/1991 | Watanabe et al. | 357/24 |
| 5,045,906 | 9/1991 | Nagaya . | |

OTHER PUBLICATIONS

IEEE Transactions on Electron Devices, vol. ED–34, No. 5, pp. 1052–1056, May 1987, N. Teranishi, et al., "Smear Reduction in the Interline CCD Image Sensor".

*Primary Examiner*—Gene M. Munson
*Attorney, Agent, or Firm*—Oblon, Spivak, McClelland, Maier & Neustadt

[57] ABSTRACT

A solid-state imaging device includes an array of photosensitive cells, each of which includes a photoelectric conversion section, which is arranged on the surface of a substrate and has a light-receiving opening. The photoelectric conversion section generates a packet of electrical carriers in response to the amount of incident light thereinto through the opening. A charge transfer section is arranged adjacent to the photoelectric conversion section on the substrate surface. This transfer section defines thereunder a transfer channel region that extends linearly in a predetermined direction in the substrate surface, and causes the carriers thus obtained to move sequentially. A light-shield section is arranged to cover the photoelectric conversion section except the opening, for preventing an incident light coming through the opening from being introduced into the transfer channel region as a leak component, by cutting off an internal reflection path of the leak component thereto.

7 Claims, 17 Drawing Sheets

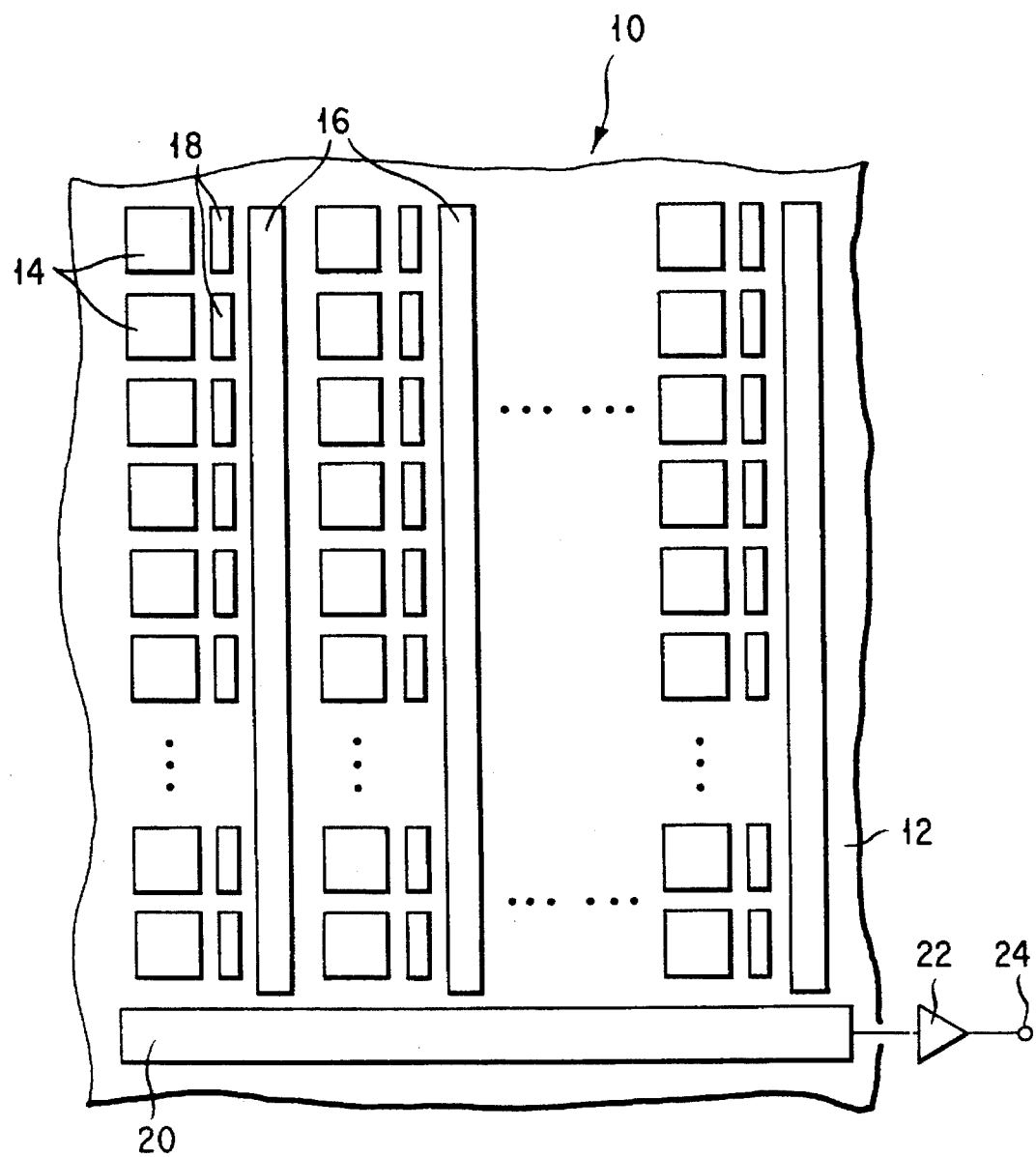
F I G. 1

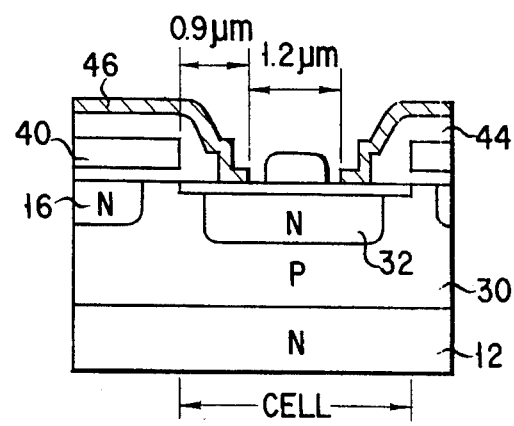
F I G. 5C

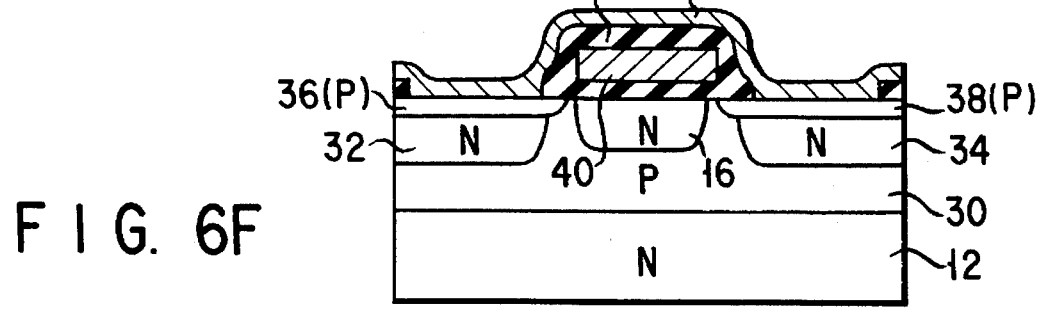
FIG. 6E
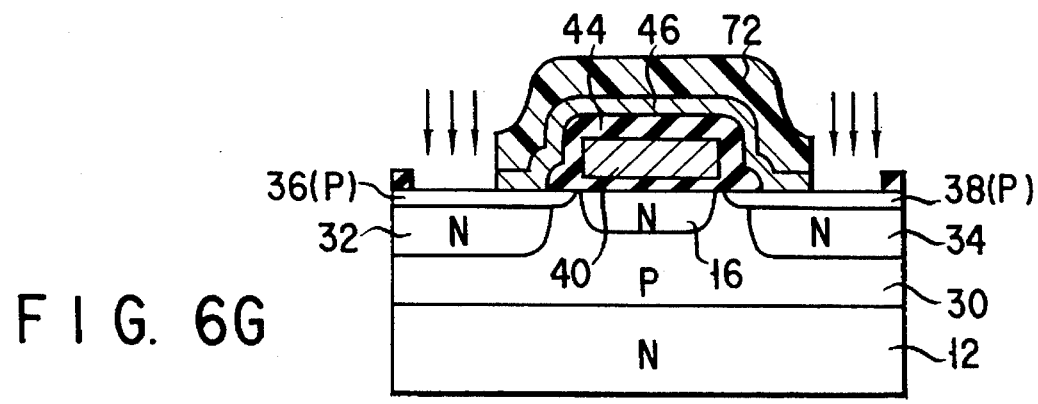
FIG. 6F
FIG. 6G
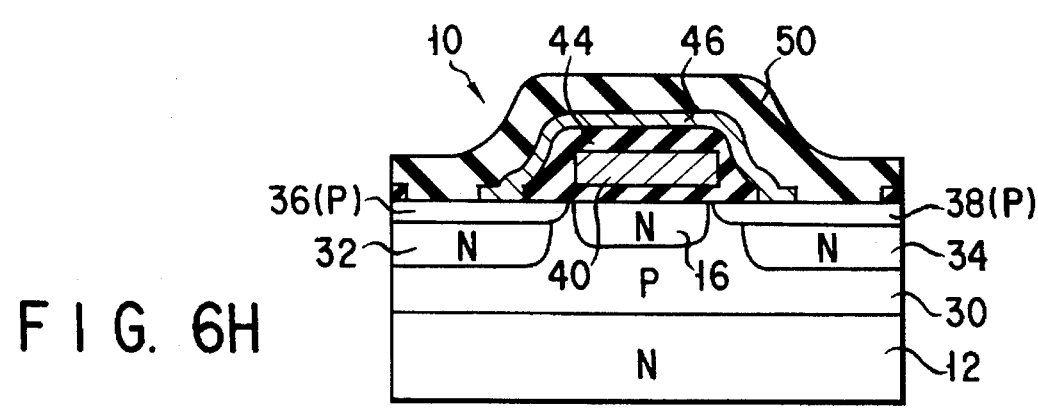
FIG. 6H

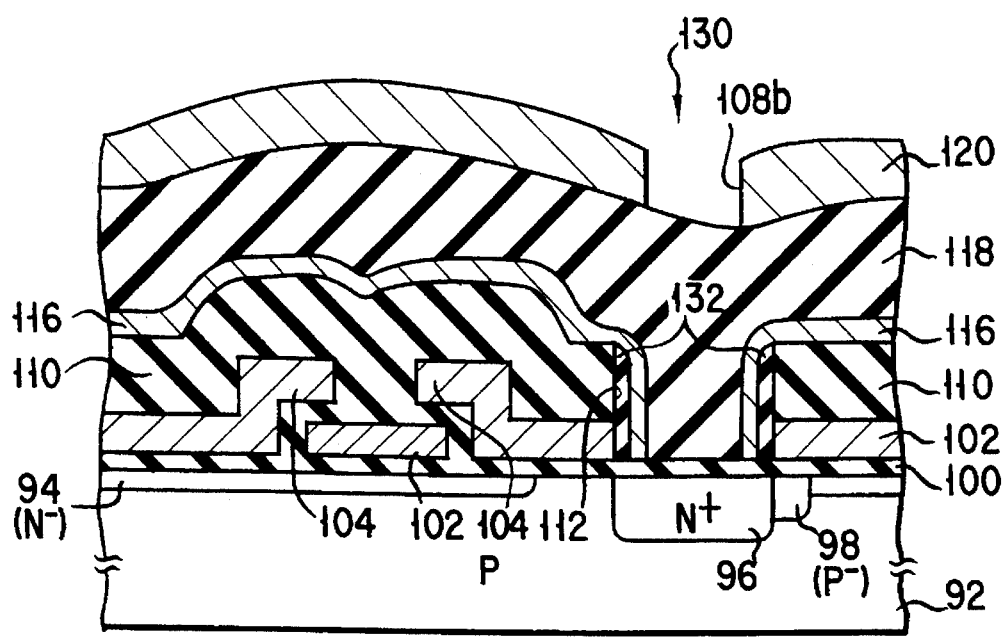
F I G. 11
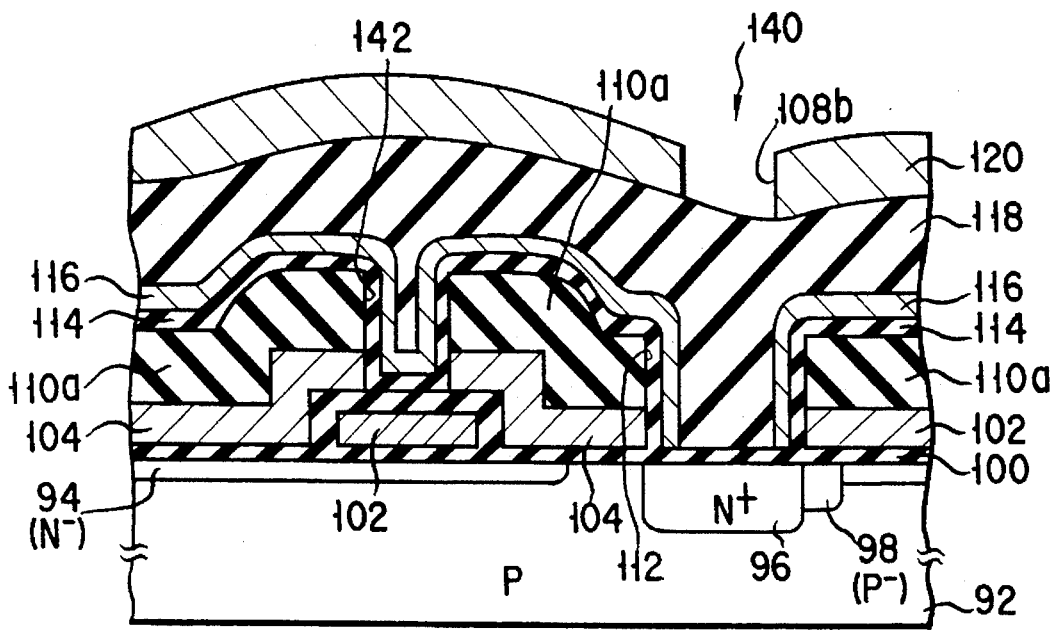
F I G. 12

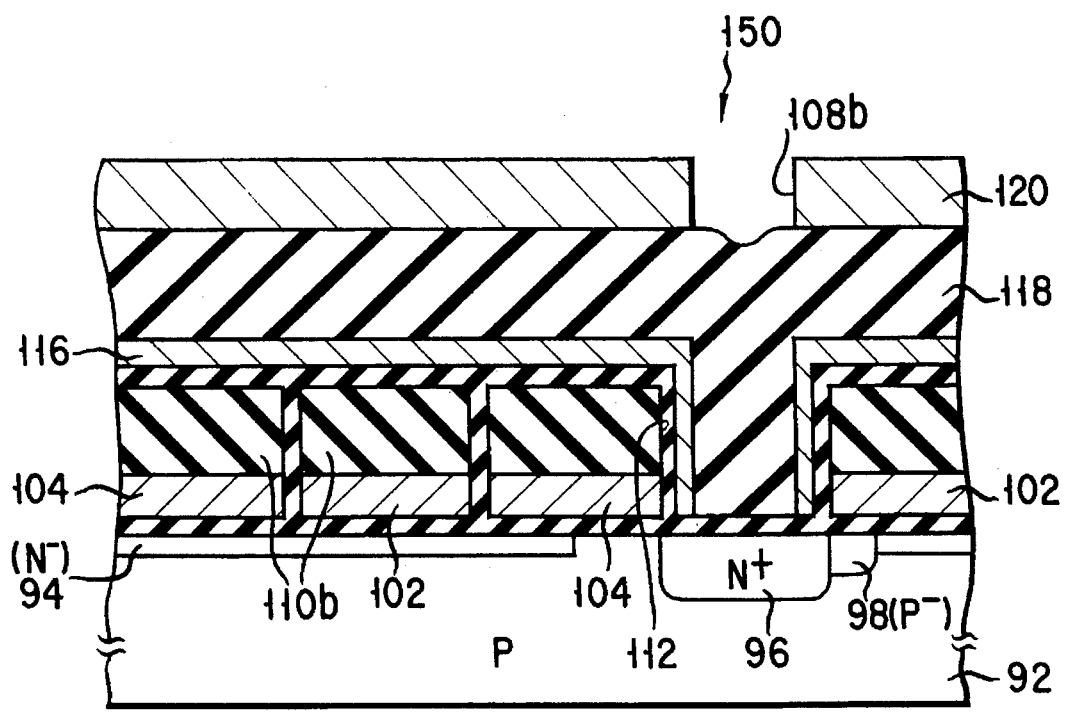
F I G. 13

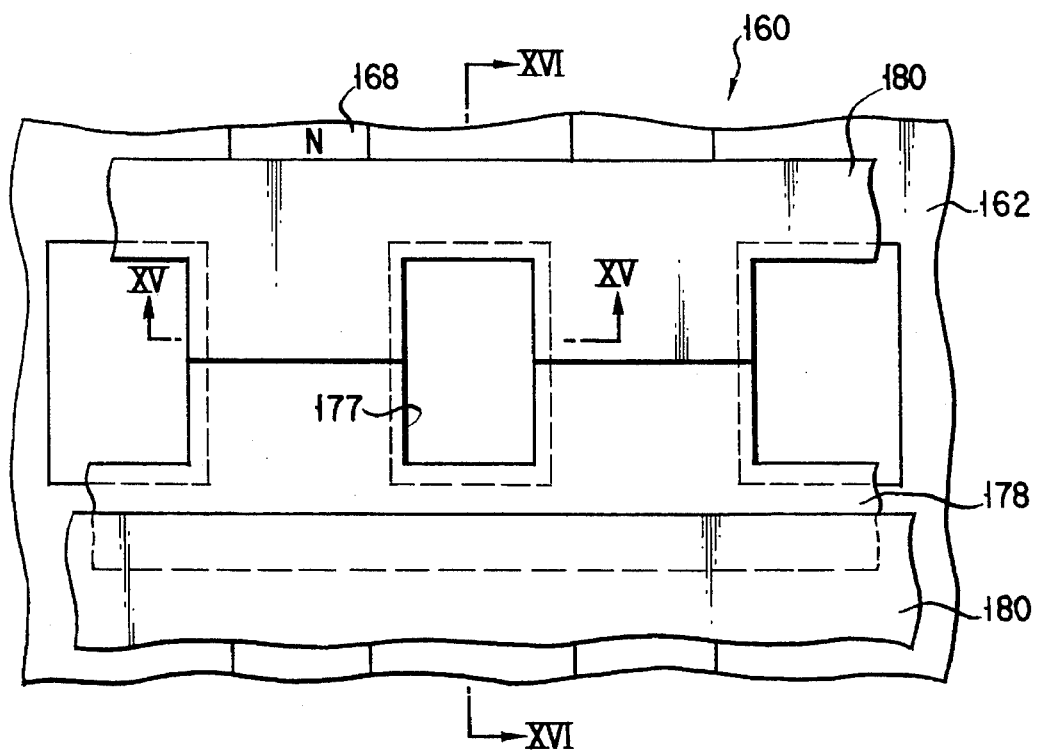
F I G. 14
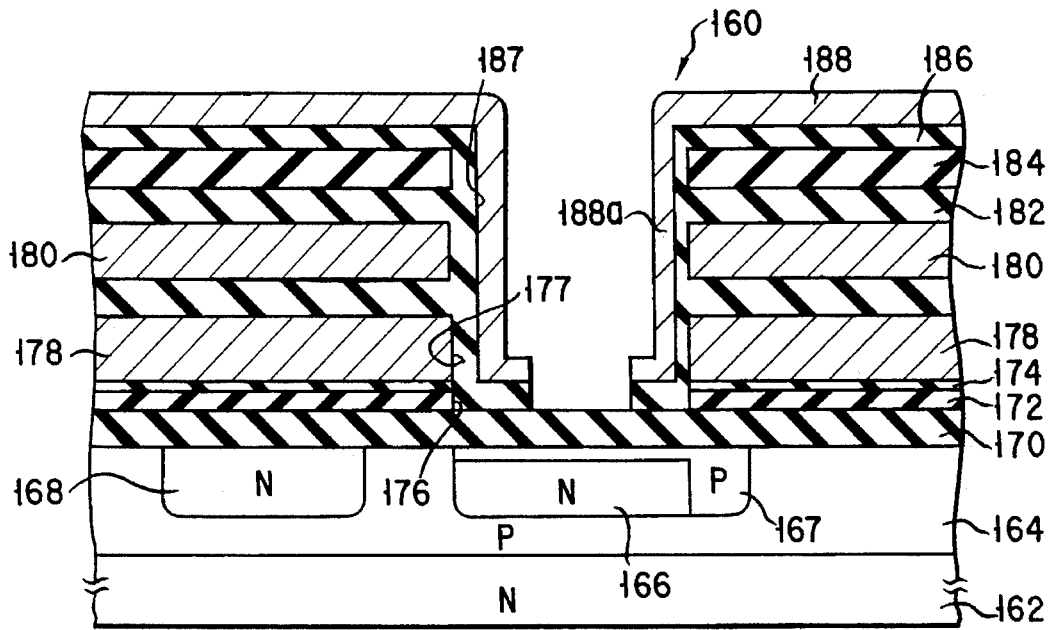
F I G. 15

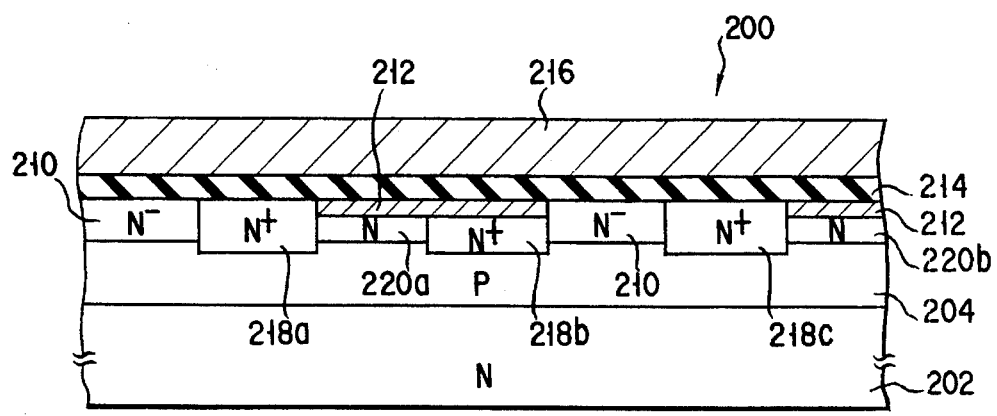
F I G. 19
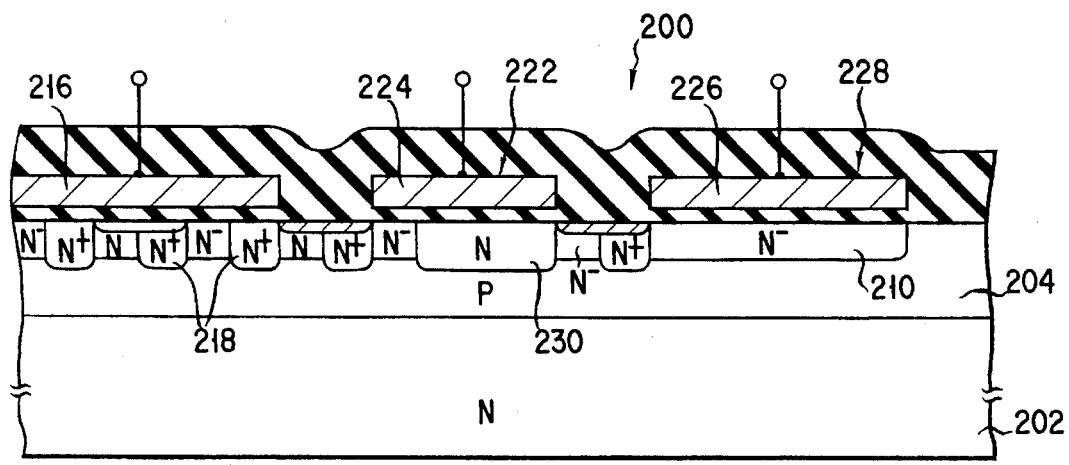
F I G. 20

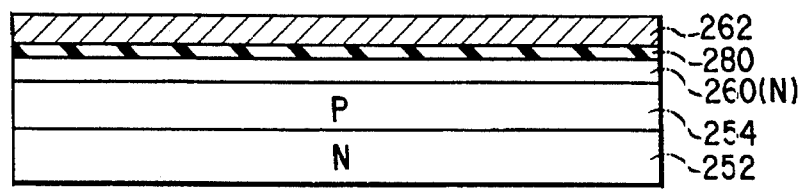
F I G. 23A
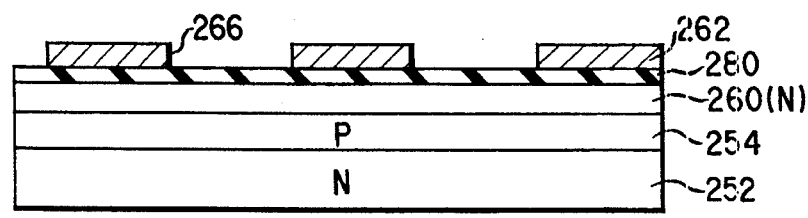
F I G. 23B
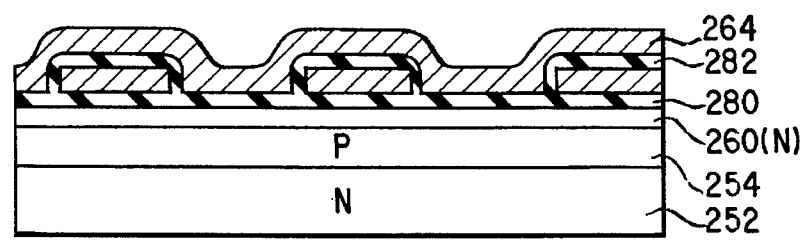
F I G. 23C
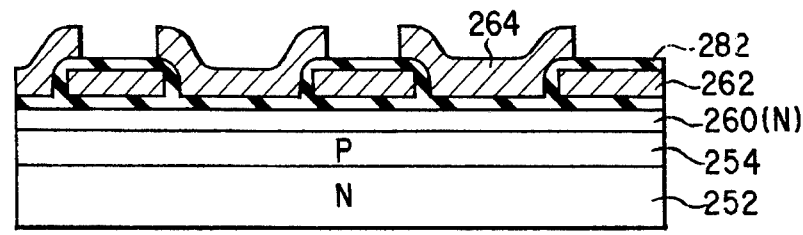
F I G. 23D
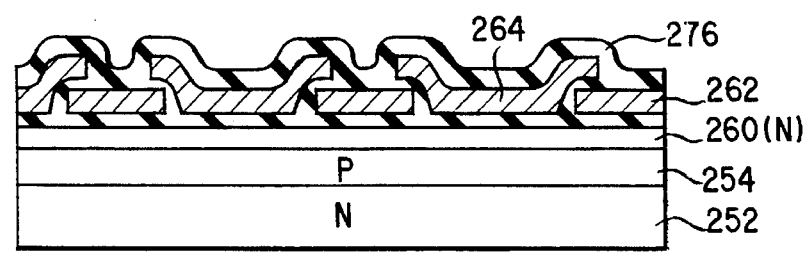
F I G. 23E

SOLID-STATE IMAGING DEVICE WITH INTERNAL SMEAR ELIMINATOR

This application is a Continuation of application Ser. No. 07/831,362, filed on Feb. 5, 1992, now abandoned.

BACKGROUND OF THE INVENTION

1. Field of the Invention

The present invention relates generally to solid-state imaging devices, and more particularly to a semiconductor image sensor employing a charge transfer device such as a charge coupled device.

2. Description of the Related Art

Recently, as charge coupled devices (CCDs) have been much improved in the integration density of photosensitive cells, their applicability has been expanded. In particular, highly integrated CCD image sensors are increasingly used as the image sensing units for small-sized electronic home-use video cameras. Typically, the CCD device includes a planar matrix configuration of picture elements arranged on the substrate. The cell matrix essentially consists of an array of rows and columns of picture elements (referred to as "pixels" among those skilled in the art). Each pixel has a photodiode acting as a photosensing section for producing electrical charge carriers (generally called the "signal carriers") in response to an incident light and temporarily storing the carriers therein. The signal carriers read out from each column of pixels are then transferred to an output section of the CCD device through a corresponding vertical transfer CCD section associated therewith and a horizontal transfer CCD section coupled thereto.

According to expanding demands for further improvement in the integration density, when the allocated area for each pixel on the substrate surface decreases, it becomes more difficult to maintain good quality of images sensed by a presently available CCD image sensing device. The major reason for this is as follows. The CCD image sensor basically employs a PN-junction semiconductor photodiode as its photosensitive cell element. The photodiode is formed in a selected pixel area on the top surface of a silicon substrate. The substrate surface is covered by a transparent dielectric layer such as a silicon oxide film. A multi-stage transfer electrode, which defines a vertical charge-transfer section associated with a corresponding column of pixels, is buried in the dielectric layer. The dielectric layer is of uniform thickness on the substrate. A shielding electrode is disposed on the dielectric layer and has an opening that is formed therein to define a light-reception area of one pixel.

The pixel opening of the shielding electrode is arranged to partly overlap the PN-junction section of photodiode. In other words, the shielding electrode overlies the vertical transfer section, and its side end portion for defining the opening edge overlaps the peripheral area of the PN-junction photodiode section to provide an "overhung" portion. This overhung portion may function to cut off a leak component of incident light, which tends to straggle or "migrate" into the vertical charge-transfer section. This may be similar in function to eaves of an ordinary house. It will possibly happen for the incident light to be partially "straggled" to enter the vertical transfer section, rather than into the aimed PN-junction photodiode, due to what is called the "multi-reflection" in the transparent dielectric layer between the substrate surface and the shielding electrode. Such a light leakage to the vertical transfer section behaves badly to reduce the effective (net) amount of signal carriers, which leads to undesirable generation of a false image, such as "smear," on a sensed image. The aforementioned overhung portion of the shielding electrode must be required to eliminate such image-quality degradation.

The overhung arrangement, however, suffers from very serious conflicting problems as will be described below. As the integration density of CCD image sensors is being further improved, the occupation area of each pixel on the substrate will decrease. This will cause the overhung (or "eaves") portion of the shielding electrode to be narrower. This should be required because, if the overhung portion is simply kept constant while the cell size is decreased, the effective photosensing area of cell opening will obviously become smaller. The reduction of effective cell area will limit the amount of sensible light that is permitted to enter the photodiode. The resultant amount of signal carriers to be photoelectrically produced therein will also be reduced accordingly. This brings another problem: reduction of the signal-to-noise ratio of the image sensor. In view of the above, the elimination of leak light component and the accomplishment of higher integration density are technically in conflict with each other. Solving these conflicting problems has been long desired by the semiconductor manufacturers.

SUMMARY OF THE INVENTION

It is therefore an object of the present invention to provide a new and improved solid-state imaging device that is highly integrated on a substrate and yet can perform image sensing operations with higher quality.

In accordance with the above object, the present invention is drawn to a specific imaging device that includes an array of photosensitive cells, each of which includes a photoelectric conversion section arranged in the surface of a substrate, for having a light-incident opening, and for generating electrical charge carriers in accordance with a light incident thereinto through the opening. A charge-transfer section is arranged adjacent to the photoelectric conversion section in the substrate surface, for defining thereunder a transfer channel region extending in a predetermined direction in the substrate, and for causing charge carriers to move through the channel region. A light-shield section is arranged to cover the photoelectric conversion section except the opening, for preventing an incident light through the opening from being introduced into the transfer channel region as a leak component, by cutting off an internal reflection path of the leak component thereto.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 1 is a diagram showing schematically the overall arrangement of a CCD image sensor in accordance with one preferred embodiment of the present invention.

FIG. 5C shows the cross-sectional CCD structure of an embodiment of the invention corresponding to FIGS. 1 through 4 for purposes of comparison with the conventional structures of FIGS. 5A and 5B;

FIG. 6A–6H illustrate, in schematic cross-section, some of the major steps in the process of the CCD image sensor shown in FIGS. 1 to 4.

FIGS. 11 to 13 are diagrams showing the cross-sectional structures of some possible modification of the embodiment shown in FIG. 10.

FIG. 14 is a diagram schematically the fragmentary plan view of a CCD image sensor in accordance with a still another embodiment of the present invention.

FIG. 15 is a diagram showing the cross-sectional view of the embodiment shown in FIG. 9 along line XV—XV.

FIG. 19 is a diagram showing the cross-sectional view of the embodiment of FIG. 17 along line XIX—XIX.

FIG. 20 is a diagram showing the cross-sectional view of the peripheral section of the sensor shown in FIG. 17, including a signal carrier-adder section and a horizontal charge transfer section.

FIGS. 23A–23E illustrate, in schematic longitudinal cross-section, some of the major steps in the process of the CCD image sensor shown in FIGS. 21 and 22.

DETAILED DESCRIPTION OF THE PREFERRED EMBODIMENTS

Figure 2:
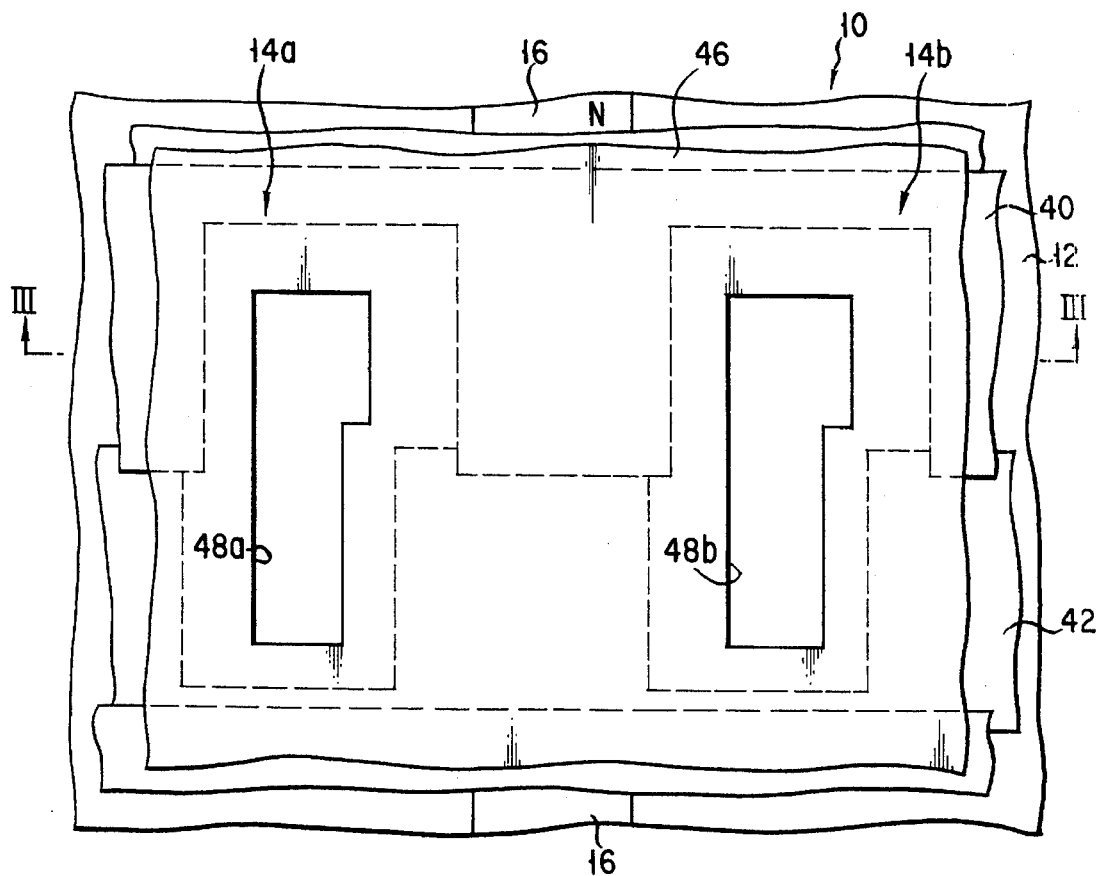
FIG. 2 is a partly enlarged plan view of the CCD image sensor of FIG. 1.

Referring now to FIG. 1, a CCD image sensor in accordance with one preferred embodiment of the present invention is generally designated by numeral "10." CCD image sensor 10 has a semiconductive substrate 12. This substrate may be made from silicon of N type conductivity. An array of rows and columns of picture elements 14 are arranged on the substrate 12 as shown in FIG. 1. These picture elements 14 will be called the "pixels," or more simply "cells." Cells 14 have a matrix configuration on the substrate surface. Each of these pixels 14 includes a PN-junction photodiode element, the detailed internal structure of which will be explained later in this description.

Each column of photodiode cells is associated with a corresponding one of vertical charge-transfer sections 16. A signal carrier readout section 18 is arranged between each cell column and a corresponding vertical transfer section 16 associated therewith. Vertical transfer sections 16 may also be referred to as "vertical CCD channels" in some situations.

As shown in FIG. 1, the vertical transfer sections 16 have signal-carrier outputs, at which these sections are coupled to a horizontal charge-transfer section 20. Horizontal transfer section 20 may also be called the "horizontal CCD channel." Horizontal transfer section 20 receives signal carriers that are transferred from vertical transfer sections 16, and cause them to move sequentially toward the output thereof. A known amplifier circuit 22 is connected to the output of horizontal transfer section 20. This amplifier amplifies the signal carriers; the amplified carriers appear at an output terminal 24 of the CCD image sensor 10.

Figure 3:
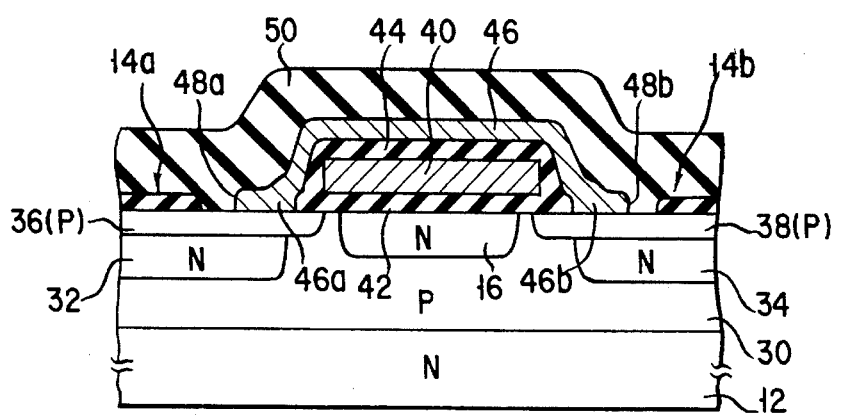
FIG. 3 is a diagram showing the cross-sectional view of the embodiment shown in FIG. 2 along line III—III.
Figure 4:
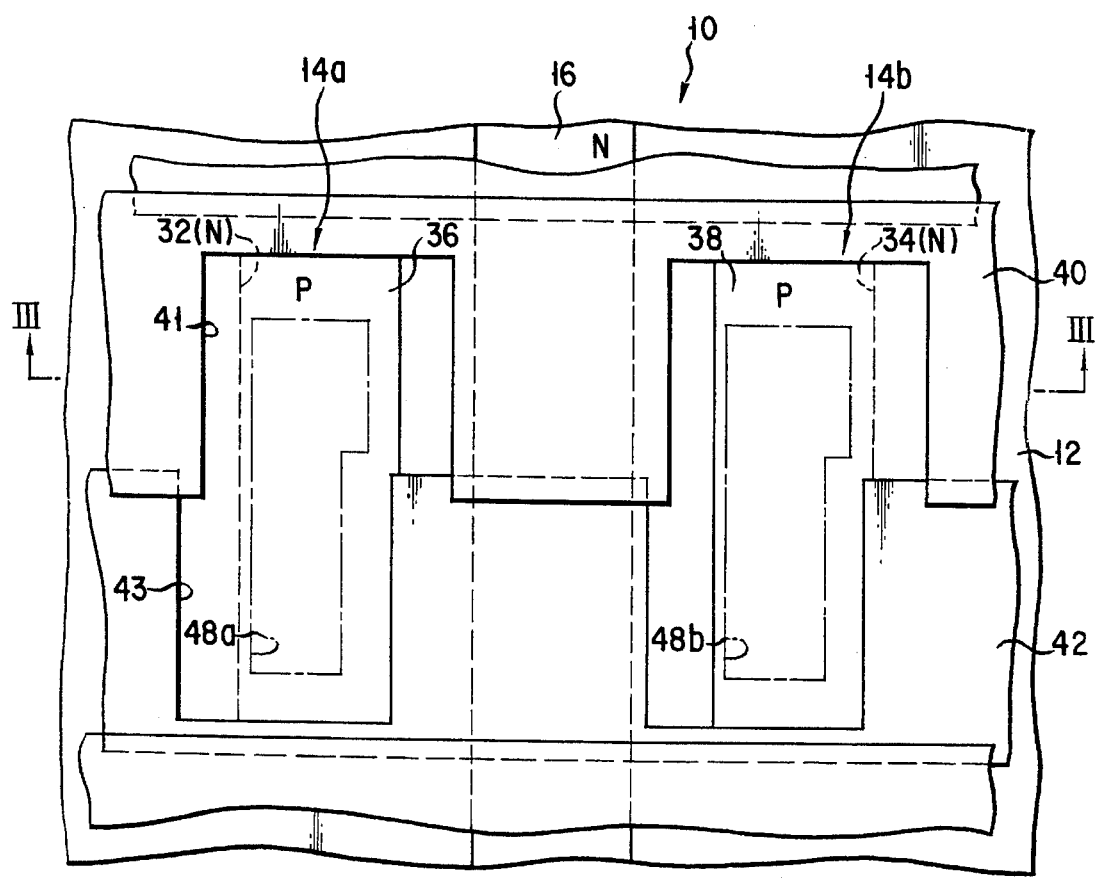
FIG. 4 reveals the detailed layout of the underlying layers of the embodiment shown in FIG. 2 by removing the uppermost shielding electrode thereof.

A certain vertical transfer section 16 and two cells 14a and 14b that are positioned on the opposite sides of section 16 are illustrated in detail in FIG. 2. The cross-sectional view of the structure along line III—III is shown in FIG. 3 (not drawn to scale). For reference convenience, the internal multi-layered structure is presented in FIG. 4, by removing the illustration of the uppermost layer (a shielding layer) to reveal a detailed patterning layout of the underlying layers. Intermediate dielectric layers are omitted from FIGS. 2 and 4 for illustration purposes only.

As is apparent from FIG. 3, the N type silicon substrate 12 has a P type well region 30 in its top surface section. N type diffusion layers 32, 34 are arranged at selected positions corresponding to cells 14a, 14b in well region 30. These layers 32, 34 are in contact with well region 30 while they are spaced apart from each other. The PN junction between layer 32 and well 30 constitutes a photodiode element for cell 14a; the PN-junction between layer 34 and well 30 constitutes a photodiode for cell 14b. These photodiodes serve as photosensitive cell sections. P type layers 36, 38 are formed at the substrate surface section in well 30 so that the layers 36, 38 are in contact with the top portions of N type layers 32, 34, respectively. P type layers 36, 38 are added to suppress or eliminate the generation of dark current.

As shown in FIG. 3, an N type charge-transfer channel layer is formed between spaced-apart layers 32, 34 in well region 30, to act as the vertical transfer section 16 of FIG. 1. An elongate conductive layer 40 is insulatively disposed above channel layer 16. Layer 40 is electrically insulated by a gate insulation film 42 from the substrate 12. Layer 40 is a part of the multi-stage vertical transfer electrode structure aligned along the extending direction of N type channel layer 16. As is apparent from FIG. 4, this multi-stage electrode structure includes two types of layers 40, 42 that partly overlap with each other in the vertical transfer direction of the image sensor 10. Each of layers 40, 42 is a conductive layer which extends in a specific direction transverse to the row direction—i.e., the longitudinal direction of the vertical transfer sections 16—and which has a rectangular cut-off portion 41 (or 43) in the cell area. A dielectric layer 44 overlies vertical transfer electrode 40. A metallic layer 46 overlies dielectric layer 44, and serves as the previously described shielding electrode, which "intercepts" incident light.

As shown in FIG. 2, the shielding electrode 46 has openings (windows) 48a, 48b, which are located in the specific surface areas corresponding to photodiode cells 14a, 14b, respectively, and which permit incident light to enter the photodiodes through openings 48a, 48b. These openings are shown by a dash-and-dot line (imaginary line) in FIG. 4, wherein the illustration of shielding electrode 46 is omitted. The multi-layered structure including shield electrode 46 on substrate 12 is entirely covered by a dielectric layer 50, which is made from silicon oxide material and serves as a protection layer.

very importantly, the shielding electrode 46 has an edge 46a, which defines the size of the cell opening 48a and which is in directly contact with the top surface of substrate 12 in the photodiode formation area of cell 14a, as clearly shown in FIG. 3. The electrode edge 46a is physically "junctioned" with P type layer 36. Similarly, the opposite edge 46b of shielding electrode 46, which defines cell opening 48b, is in directly contact with the substrate surface in the formation area of cell 14b. Electrode edge 46b is physically junctioned with P type layer 38. The direct junction of shielding electrode 46 with P type layers 36, 38 causes electrode 46 to be electrically separated from N type layers 32, 34 of cell photodiodes 14a, 14b. To enhance this electric separation, shielding electrode 46 is applied with a specific voltage potential that is potentially equal to or greater than the voltage on P type layers 36, 38; normally, it is a reference voltage.

With such an arrangement, since both sides of the vertical transfer electrode 40 can be covered almost perfectly by the overlying shielding electrode 46, it becomes possible to suppress or eliminate any multi-reflection of an incident image light being presently introduced through the windows of cells 14a, 14b, which reflection tends to be generated within the transparent dielectric layer sandwiched between the substrate surface and shielding electrode 46. This enables cutting off almost perfectly any leak components of incident light, which tends to "migrate" into the vertical transfer channel region 16. As a result, it is possible to minimize the generation of leak carriers within the vertical transfer section, thereby to effectively suppress smear phenomenon in the CCD image sensor 10. The image quality can thus be much improved.

Furthermore, carrier injection from the shielding electrode 46 into the individual cell photodiode section can be prevented by causing the voltage to be given to the shielding electrode 46 at a selected potential that is equal to or higher than those at the P type layers 36, 38. This can be lead to successful suppression of pixel defects during image-sense operation, such as what is called the "white scratching" phenomenon. The image quality of sensor 10 can thus be further improved.

In addition, according to the embodiment, the above "shielding-electrode/substrate-surface direct contact" feature can provide a surprising effect: this feature can also contribute to improvement in the integration density of the CCD image sensor 10. The reason for this is as follows. Principally, employing the "direct contact" feature can increase the ratio of opening 48 with respect to the cell occupation area on substrate 12, i.e., the cell aperture ratio. This results in that the effective (net) occupation area of each cell can be decreased while having the cell aperture ratio kept unchanged. The reductionability of the net occupation area for each cell can increase the number of cells allowed to be arranged on the substrate of image sensor 10; obviously, the resultant packing density of photosensing cells can be improved.

Figure 5A:
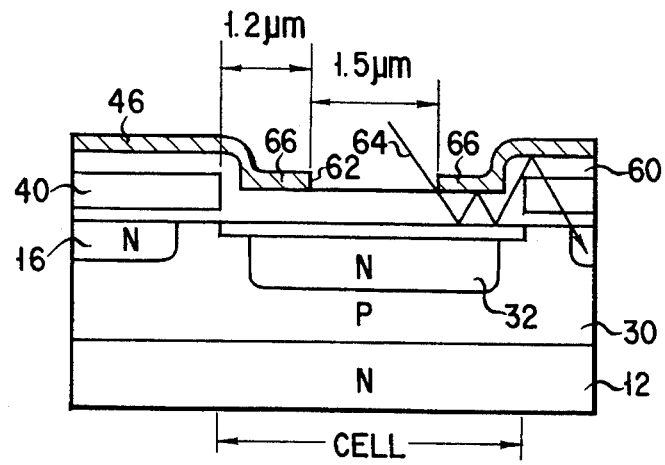
FIGS. 5A and 5B illustrate cross-sectional CCD structures according to the prior art.

The above cell-integration improvement effect will now be demonstrated with reference to the experimental data shown in FIG. 5. First, let's refer to FIG. 5A, which illustrates the cross-sectional structure of one photosensitive cell section that has been conventionally employed in CCD image sensors. To increase efficiency of explanation, similar reference numerals are used to designate similar components to those of the previously described first embodiment.

With the conventional structure of FIG. 5A, unlike the FIG. 3 embodiment of the invention, a dielectric layer 60 overlying the transfer electrodes 40 simply covers the substrate top surface uniformly. Shielding electrode 46 has a cell opening 62. A "migration" leak light component caused due to the multireflection is represented by a "triangular-folded" or zigzag arrow 64. To suppress such leak component 64, shielding electrode 46 is arranged to have an "eaves" portion 66. The amount of leak component into the vertical CCD transfer section can be decreased by increasing the horizontal extending length of portion 66, i.e., by extending the overlap between shielding electrode 46 and photodiode layer 32. Such increase in length of portion 66, however, may reduce the effective (net) area of photosensitive cell, causing the integration density of the CCD image sensor to decrease. This example assumes that one cell is 7 micrometers in size. To eliminate leak component 64, the horizontal length of portion 66 should be required to measure as much as 1.2 micrometers when the opening width of the photodiode section is 1.5 micrometers. The resultant amount of smear in this case is −80 dB.

Figure 5B:
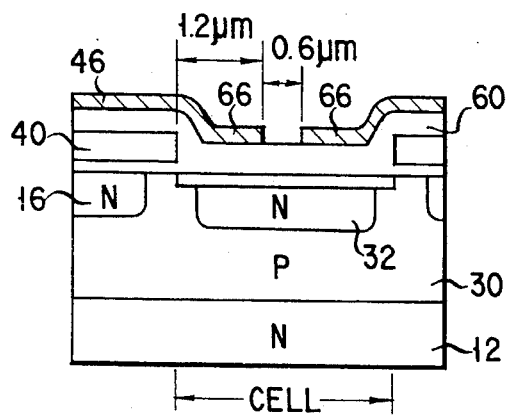

A cell structure of FIG. 5B is another example that may be conventionally available. Note that, however, one cell is miniaturized to measure 5 micrometers in size in order to attain high integration density of the CCD image sensor. Even with this example, it is still required that the length of eaves portion 66 of the shielding electrode 46 remains unchanged for better elimination of leak component interference. This results in that the net area of cell opening is reduced to 0.6 micrometers. In such a case, better image-sensitivity can no longer be expected. To balance the above conflicting requirements, technical challenge to attain further integration density will soon reach the limit of development.

A cell structure of FIG. 5C, which may correspond to that shown in FIG. 3, employs the previously explained "shielding-electrode/substrate-surface direct contact" feature. Assuming that the structure of FIG. 5C is the same in size as the FIG. 5B structure, the effective photosensible cell area can be approximately doubled 0.6 micrometers up to 1.2 micrometers, by removing the eaves portion 66 of the shielding electrode of FIG. 5B. The cell sensitivity can thus be enhanced. Moreover, it becomes possible, by forcing the edges of shielding layer 46 to be in direct contact with the substrate surface, to prevent almost perfectly any leak component from entering the charge-transfer section. Our experiment tells us that, with the FIG. 5C structure, the measured smear was suppressed down to −100 dB or less. As a consequence, the CCD image sensor in accordance with the present invention can break through the limit and achieve higher integration, without damaging the image sensing performance of the image sensor.

Figure 6A:
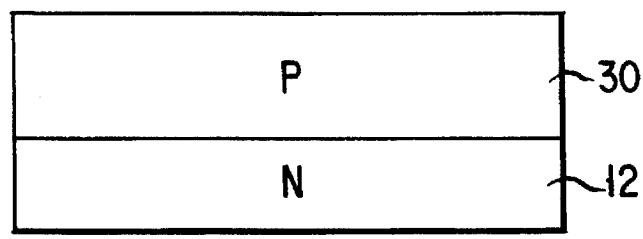
Figure 6B:
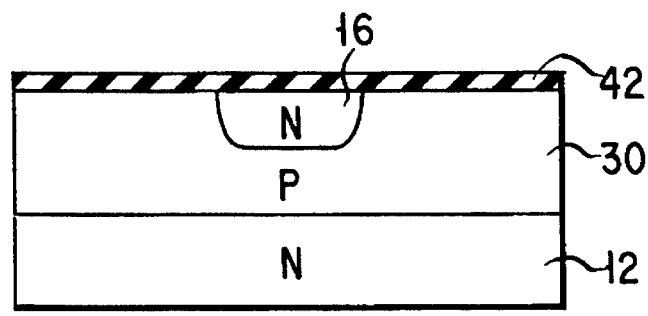

The process of fabricating the image sensor 10 may be effectively performed with presently available manufacturing techniques. The manufacture of it is as follows. Firstly, as shown in FIG. 6A, P type impurity such as boron (B) is doped by known ion implantation into the top surface of N type silicon substrate 12. P type well region 30 is then formed in substrate 12. Subsequently, as shown in FIG. 6B, thermal oxidization process is performed to form a silicon-oxide thin film 42 on the substrate surface. This thin film is the gate insulation film 42 of FIG. 3. Then, N type impurity is selectively doped in well region 30 with a patterned resist layer (now shown) being as a mask therefor, thereby to define N type buried channel region 16. This region may serve as the vertical charge-transfer section of the CCD image sensor 10.

Figure 6C:
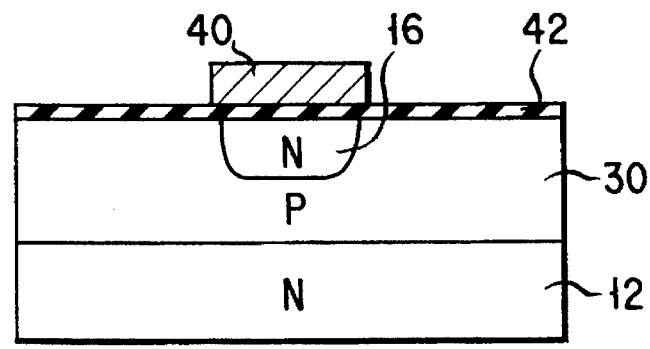
Figure 6D:
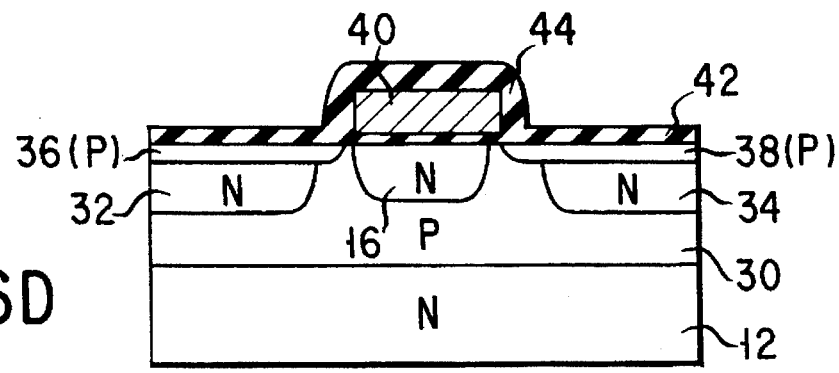

Subsequently, as shown in FIG. 6C, a polycrystalline silicon layer 40 is deposited on the gate insulation layer 42 such that it overlies the vertical transfer channel region 16. Layer 40 is then subjected to a patterning process to become the vertical transfer electrode 40 shown in FIG. 3. Thereafter, as shown in FIG. 6D, the resultant structure is subjected to the second thermal oxidization process, so that an oxide layer 44 is formed overlying the vertical transfer electrode 40. PN-junction photodiodes are then formed in well region 30, with making use of a resist mask (now shown). These photodiodes serve as the photosensitive cell sections. Note that only two photodiodes are visible in FIG. 6D, i.e., a photodiodes having N type layer 32 and P type layer 36 and another one having N type layer 34 and P type layer 38. During this process, the formation of the previously described cell matrix configuration is completed.

A resist layer (not shown) is deposited on the resultant structure of FIG. 6D, and is patterned to form a patterned resist layer 70 shown in FIG. 6E. By using resist layer 70 as a mask, the structure of FIG. 6D is then subjected to an etching process. The gate insulation film 42 is selectively removed at the cell areas, so that the substrate surface is partly exposed. The resist mask 70 is removed.

Subsequently, as shown in FIG. 6F, the resulting structure is entirely covered by a metallic thin-film 46 deposited thereon. Film 46 may be made from metal such as aluminum, high-melting-point metal such as tungsten, or silicide thereof. A resist layer is deposited on film 46, and then subjected to a patterning process, thereby to obtain a patterned resist layer 72 as shown in FIG. 6G. By making use of this resist layer 72 as a mask, the structure of FIG. 6F is etched selectively. With the selective etching process, film 46 is configured to have the cell openings 48a, 48b that are typically shown in FIG. 2. After resist mask 72 is removed, shielding electrode 46 is formed. Finally, dielectric protection film 50 is deposited entirely on the resultant structure. The CCD image sensor 10 is now completed.

Figure 7:
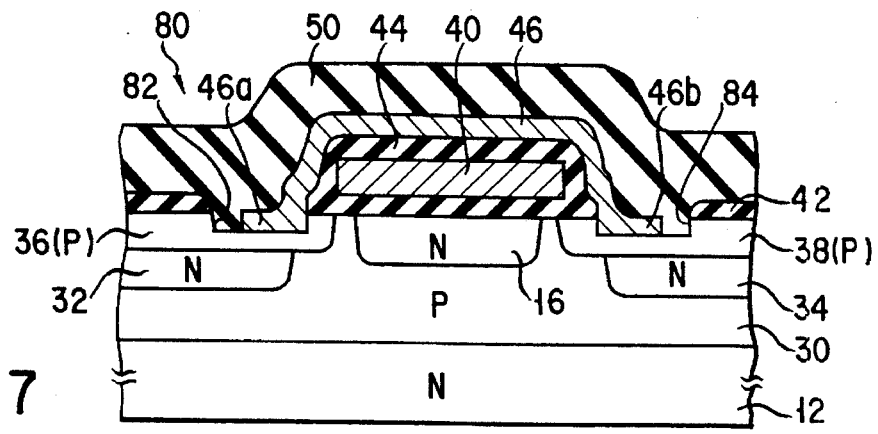
FIG. 7 is a cross-sectional view of one modification of the CCD image sensor shown in FIG. 3.

A CCD image sensor structure 80 of FIG. 7 is similar to that shown in FIG. 3 with concave or recessed portions (grooves) 82, 84 being additionally formed in the dark-current restriction layer 36. The edges 46a, 46b of shielding electrode 46 terminate on the bottom surfaces of grooves 82, 84. Edges 46a, 46b are in contact with P type layers 36, 38 physically and electrically in the grooves. With such an arrangement, the coverage of shielding electrode 46 over the vertical transfer channel region 16 is strengthened to enhance the smear-eliminating performance.

Figure 8A:
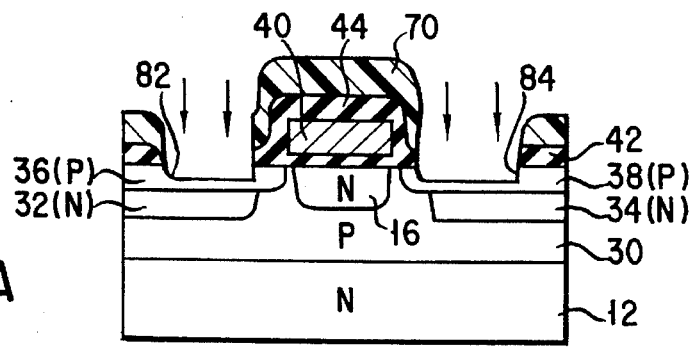
FIGS. 8A–8C illustrate, in schematic cross-section, some of the major steps in the process of the CCD image sensor shown in FIG. 7.
Figure 8B:
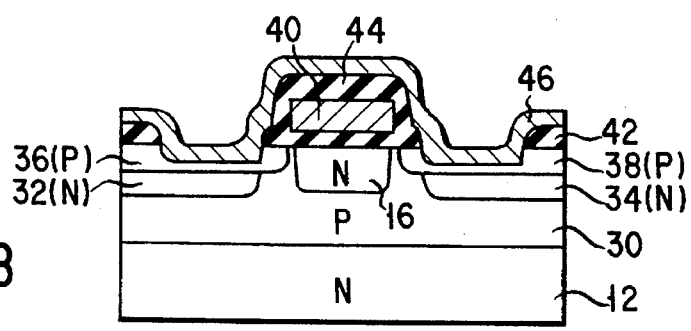
Figure 8C:
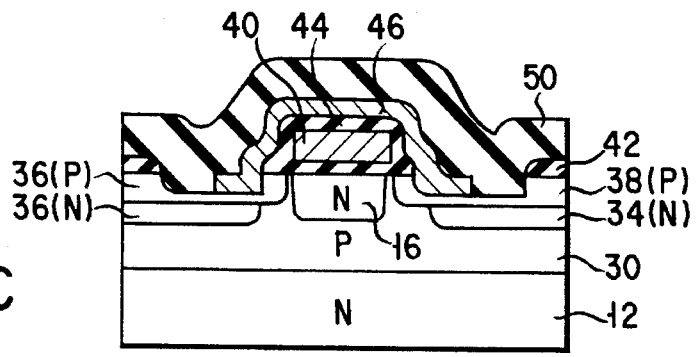

The process of forming the shielding electrode-contact grooves 82, 84 is as follows. A cross-section shown in FIG. 8A roughly corresponds to that of FIG. 6E. The difference of the structures of FIG. 8A from that of FIG. 6E is that, during the selective etching process using the patterned resist mask 70, its etching condition is so modified as to cause P type layers 36, 38 to be etched at least partially. As a result, while dielectric layer 44 is being etched, concave portions 36, 38 are formed in layers 36, 38. Subsequently, as shown in FIG. 8B, high-melting-point metallic film 46 is formed on the resultant structure. Film 46 is configured by a patterning process, which is similar to the process shown in FIG. 6G, to obtain vertical charge-transfer electrode 46. Then, as shown in FIG. 8C, dielectric protection layer 50 is deposited on the entire surface of the resultant structure to provide the CCD image sensor 80 of FIG. 7.

Figure 9:
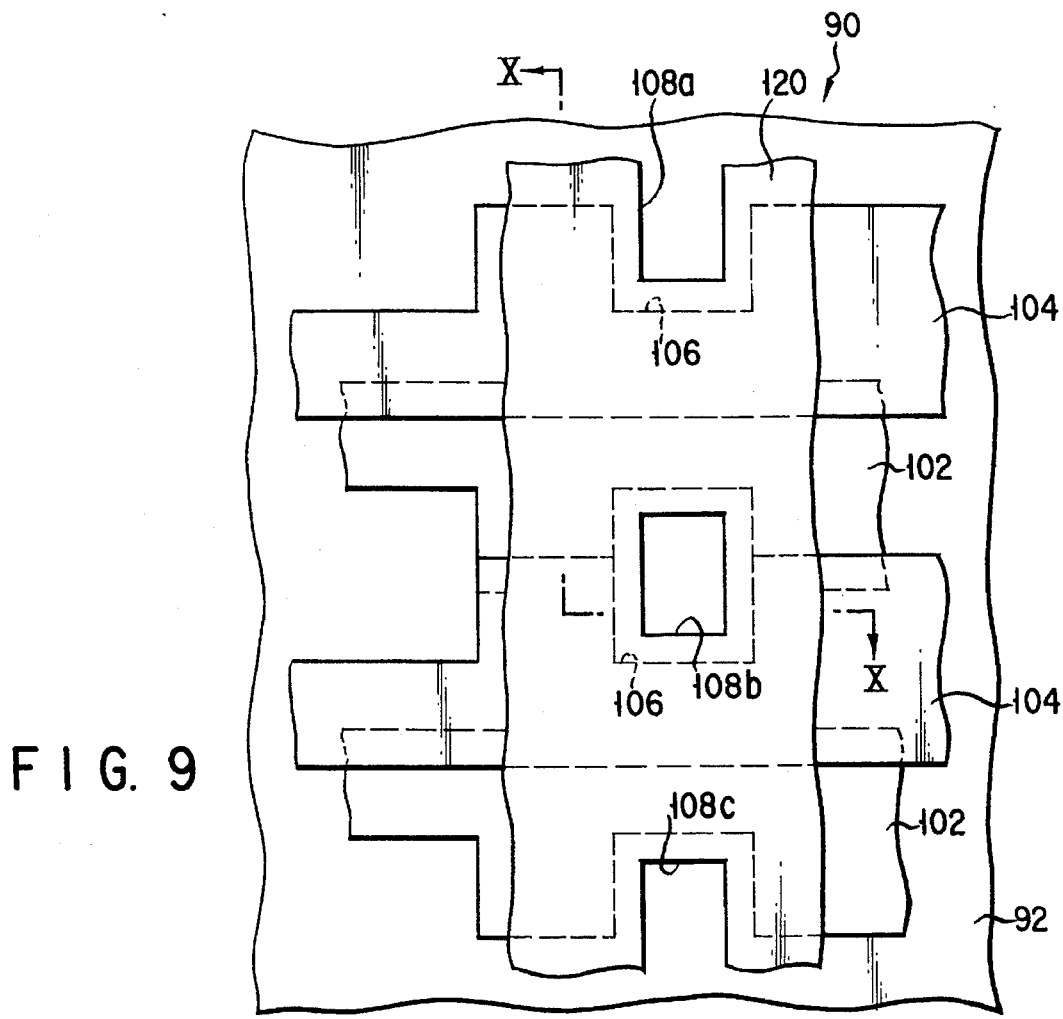
FIG. 9 is a diagram showing schematically the plan view of a CCD image sensor in accordance with another embodiment of the present invention.
Figure 10:
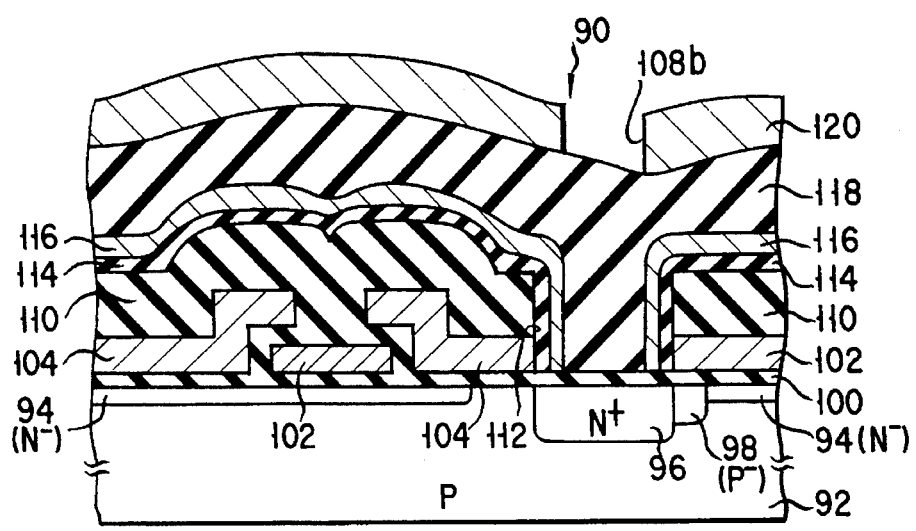
FIG. 10 is a diagram showing the cross-sectional view of the embodiment shown in FIG. 9 along line X—X.

Turning now to FIG. 9, a CCD image sensor in accordance with the second embodiment of the present invention is generally designated by "90." The cross-sectional view of the image sensor of FIG. 9 along line X—X is shown in FIG. 10. CCD image sensor 90 has a P type silicon substrate 92. As shown in FIG. 10, the top surface of substrate 92 is provided with a lightly-doped N (N−) type layer 94, which defines a vertical transfer channel region therein. A heavily-doped N (N+) type layer 96 is formed in the cell area of substrate 92 to constitute a PN-junction photodiode. A lightly-doped P (P−) type layer 98 is formed at one end portion of N+ type layer 96. The P− type layer 98 defines an element-separation area in the substrate surface.

As shown in FIG. 10, a gate insulation film 100 is arranged on the substrate 92. A multi-layered type transfer electrode structure is arranged on this gate insulation film 100 to extend in the vertical carrier transfer direction of CCD image sensor 90. The electrode structure consists of first vertical carrier transfer electrode layers 102 and second vertical carrier transfer electrode layers 104 that partly overlap the first layers at their edge portions. As shown in FIG. 9, layers 104 have openings 106, which planarly exclude cell openings 108a, 108b, 108c at the mutual overlap edge portions of layers 102, 104. Layers 102, 104 may be polycrystalline silicon layers.

As shown in FIG. 10, the first and second vertical transfer electrodes 102, 104 are covered by a thick dielectric layer 110. Typically, the thickness of dielectric layer 110 ranges from 0.3 to 0.6 micrometers. Dielectric layer 110 has an opening 112 that is substantially self-aligned with the N+ type layer 96 of the cell section. The top surface of thick dielectric layer 110 is covered by a thin dielectric layer 114. Typically, the thickness of dielectric layer 114 ranges from 0.05 to 0.3 micrometers. A lower shielding electrode 116 is arranged on thin dielectric layer 114. This shielding electrode 116 is made from molybdenum-silicide material. Electrode 116 is "adhered" to the side wall of opening 112, which is covered by thin dielectric layer 114. Another thick dielectric layer 118 is deposited on the entire top surface of shielding electrode 116. Dielectric layer 118 has a flat top surface. A metal layer 120, such as aluminum, is arranged on dielectric layer 118 to have the aforementioned openings 108, only one (108b) of which is visible in FIG. 10. Metal layer 120 serves as a second shielding electrode.

With the image sensor 90 shown in FIGS. 9 and 10, after the thick dielectric layer 110 was formed on the second vertical transfer electrodes 104 that may also act as a signal-carrier readout gate, N+ type layer 96 constituting a cell-photodiode is formed using a known ion-implantation technique in the cell area of substrate 92. This may prevent implanted ions from penetrating transfer electrode 104 to be doped into the underlying substrate 92 therethrough, thus eliminating undesirable formation of a "potential pocket" beneath the readout gate in substrate 92. It is therefore possible to prevent a read voltage from being potentially varied during the image sense operations of CCD image sensor 90, and at the same time to suppress the generation of an "after-image" in a sensed image.

Moreover, the thin dielectric layer 114 is adhered to the side wall of the opening 112 of thick dielectric layer 110, and the first shielding electrode 116 is uniformly formed thereon to a decreased thickness. The vertical side wall portion of shielding electrode 116 is allowed to position immediately adjacent to the top surface of substrate 92 in which N+ type layer 96 is arranged, thereby minimizing the possibility of generation of optical leakage therebetween. Therefore, the vertical layer portion of shielding electrode can suppress or prevent any leak component of incident light from being introduced into the vertical transfer section. This may contribute to reduction of smear. At the same time, employing the thin dielectric film 114 on the side wall of cell opening can maximize the cell aperture ratio at each photodiode. Therefore, the image sensing performance can be improved while maintaining high integration density for CCD image sensor 90.

Some modifications to the embodiment 90 are described as follows. The cross-sectional structure of a CCD image sensor 130 of FIG. 11 is similar to that of FIG. 10 with the thin dielectric layer 114 of FIG. 10 being replaced with a vertical layer 132 that is selectively arranged on the internal side wall of the cell opening 112 only. Formation of this layer may be performed by making use of a presently available self-aligned technique employing the reactive ion etching (RIE) method.

The cross-sectional structure of a CCD image sensor 140 of FIG. 12 is similar to that shown in FIG. 10 except that a thick dielectric layer 110a is selectively formed only on the second transfer electrodes 104 with gaps 142 between adjacent ones thereof. Thin dielectric layer 114 is also arranged on the internal side wall of gaps 142. With such an arrangement, it is possible to simplify and speed up the manufacturing process by allowing the etching for two polycrystalline layers on the polycrystalline layer and that for the cell openings to be performed simultaneously.

The cross-sectional structure of a CCD image sensor 150 of FIG. 13 is similar to that shown in FIG. 12 except that the first and second vertical transfer electrodes 102, 104 are alternately positioned in the same level over the substrate surface without having any overlap edge portions therebetween. A thick dielectric layer 110b is deposited on these layers 102, 104.

Turning to FIG. 14, a CCD image sensor in accordance with a third embodiment of the invention is generally designated by numeral "160." The cross-sectional view of one cell structure of FIG. 15 along line XV—XV is illustrated in FIG. 15. The main characteristic feature of this embodiment is that a silicon nitride layer is additionally arranged between transfer electrodes and the overlying shielding electrode as will be described below.

As is apparent from FIG. 15, CCD image sensor 160 has an N type silicon substrate 162. A P type well region 164 is on the top surface of substrate 162. Formation of well region 164 may be made by employing the existing ion-implantation or impurity-diffusion technique. A plurality of N type layers 166 (only one of these layers is visible in FIG. 15) are formed in cell areas of substrate 162; these layers constitute PN-junction photodiodes. A P type layer 167 is in contact with N type layer 166 in well region 164. An N type layer 168 is arranged near N type layer 166 within well region 164, defining a vertical charge-transfer channel region.

Three stacked dielectric layers 170, 172, 174 are formed on the top surface of substrate 162. Layer 170 is a silicon oxide film. Layer 172 is a silicon nitride film. Layer 174 is a silicon oxide film. Layers 172, 174 have an opening 176 that is substantially self-aligned with the underlying N type photodiode layer 166. Conductive layers 178,180 are insulatively laminated on layer 174. Layer 178 has an opening 177 contiguous from opening 176. These layers act as the vertical transfer electrodes. Transfer electrode layers 178, 180 are buried by a silicon oxide layer 182. A silicon nitride layer 184 is insulatively disposed above the underlying electrode layer 182. Silicon nitride layer 184 is covered by a silicon oxide layer 186. In other words, a lamination structure of three dielectric layers 182, 184, 186 is deposited on the upper electrode layer 180. Dielectric layers 182, 184, 186 have a cell opening 187. A shielding electrode 188 is formed on dielectric layer 186; it has a side-wall layer portion 188a, which is adhered to the vertical side wall of cell opening 188 as shown in FIG. 15. Note that the illustration of shielding electrode 188 is omitted from the plan view of FIG. 14 only for illustration purposes to reveal the patterning layout of the underlying layers.

Figure 16A:
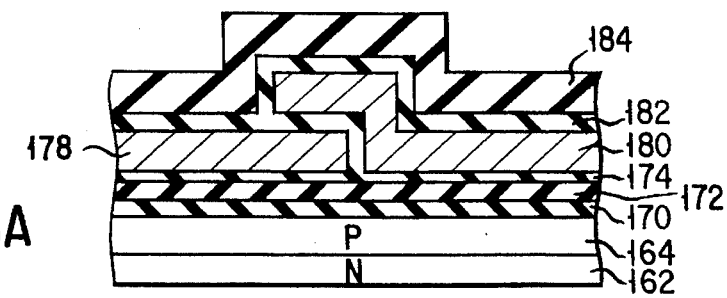
FIGS. 16A–16F illustrate, in schematic cross-section, some of the major steps in the process of the CCD image sensor shown in FIGS. 14 and 15.

The manufacturing process of the image sensor 160 will be described with reference to FIG. 16 as follows. Note that the structures shown therein are those obtained along line XVI—XVI of FIG. 14. As shown in FIG. 16A, the following layers are sequentially formed on an N type substrate 162 with a P type well region 164: three-laminated insulative layers 170, 172, 174, vertical transfer electrodes 178, 180, a silicon oxide layer 182, and a silicon nitride layer 184. Transfer electrodes 178, 180 are polycrystalline silicon layers that have been formed by a well-known gas-phase crystal-growth method to a predetermined thickness of 200 to 600 nanometers (nm), for example. Silicon nitride layer 184 is deposited by the gas-phase crystal-growth method to a predetermined thickness such as 50 to 300 nm.

Figure 16B:
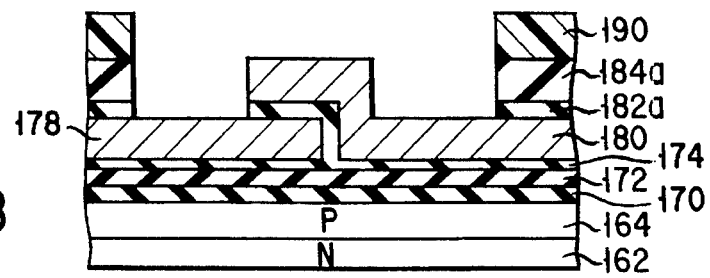

Subsequently, as shown in FIG. 16B, a resist layer 190 is formed on the silicon nitride layer 184 in a designated patterning shape. By using resist layer 190 as a mask, a RIE process is performed so that the underlying layers 182, 184 are etched selectively. The resultant patterned layers 182a, 184a exhibit their plan view that is substantially same as that of resist layer 190.

Figure 16C:
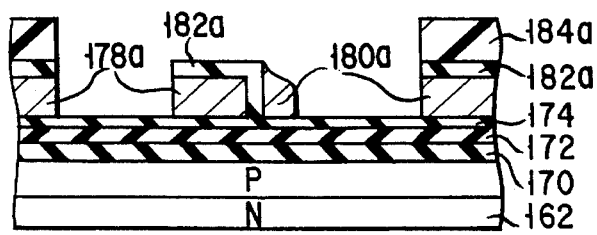

After the resist layer 190 was removed, as shown in FIG. 16C, a RIE process is performed with a silicon nitride layer 184a being as a mask. The selection ratio of polycrystalline silicon and silicon nitride is set in a range from 15 to 20. Polycrystalline silicon transfer electrodes 178, 180 are then subjected to a selective etching process so that only layer portions 178a, 180a remain as shown in FIG. 16C.

Figure 16D:
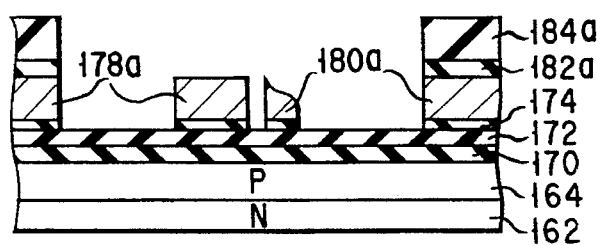
Figure 16E:
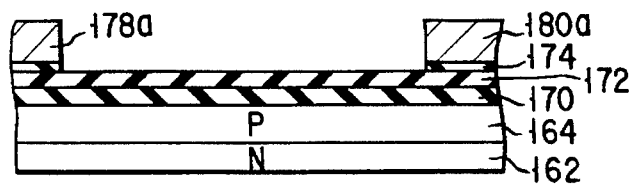

Subsequently, as shown in FIG. 16D, the dielectric layer 182a between the resultant transfer electrodes 178a, 180a is removed using ammonium fluoride (NH$_4$F). Then, as shown in FIG. 16E, the remainders of polycrystalline silicon layer, which are shown in the center of FIG. 16D, on silicon nitride film 172 are then removed, together with the silicon oxide layer portions being positioned thereunder. The selection ratio of polycrystalline silicon and silicon nitride in this case is similar to that in the previous process. With this process, it is possible to determine the size of light receiving opening 177 at high accuracy, without etching silicon oxide layer 172.

Figure 16F:
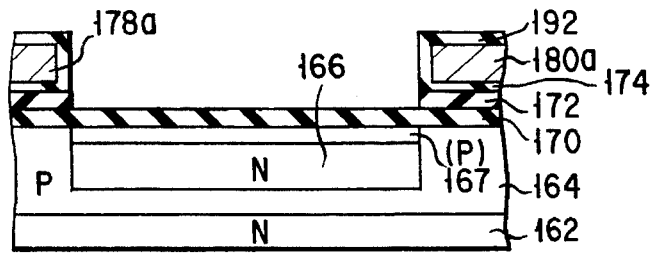

Subsequently, as shown in FIG. 16F, the exposed electrode layers 178a, 180a are subjected to a surface oxidation, thus forming an oxide thin film 192. Thereafter, ion implantation of N type impurity is performed to form N type layer 166 that is substantially self-aligned with cell opening 177 in the cell area of substrate 162. Ion implantation of P type impurity is then performed to form P type layer 167. A PN-junction photodiode is thus obtained. An aluminum thin film is formed as the shielding electrode 188 of FIG. 15, and then subjected to a patterning process, thus completing the image sensor shown in FIGS. 14 and 15.

With the image sensor 160, the total thickness of the dielectric layer between the transfer electrodes 178, 180 and shielding electrode 188 can be minimized, by adding the silicon nitride layer 184 therebetween, without raising any dielectric breakdown. In addition, the distance between the top surface of substrate 162 and the overlying shielding electrode 188 can be decreased, causing a light transmission path therebetween to be narrower. This may lead to reduction of smear due to generation of leak light component. The opening formation for the photosensitive cells can be carried out at high accuracy with a single etching process using the silicon nitride layer 184 as a mask; this is very advantageous in improving the manufacturing efficiency and the manufacturing yield of image sensors of this type, as well as the photosensitibity thereof. The improvement in photosensitibity is effected due to the fact that the alignment margin between layers 177 and 180 can be reduced down to substantially zero, thereby increasing the cell aperture ratio accordingly.

Figure 17:
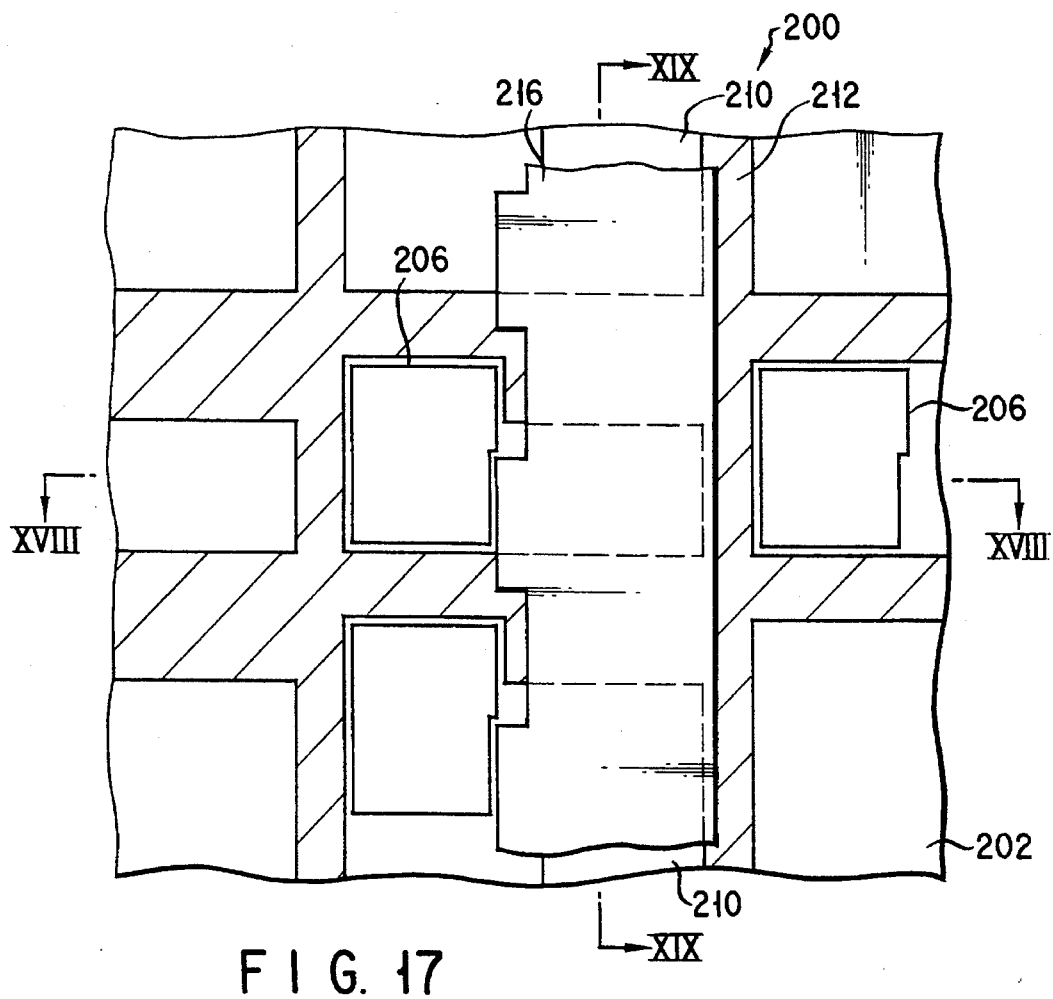
FIG. 17 is a diagram schematically the fragmentary plan view of a CCD image sensor in accordance with a further embodiment of the present invention.
Figure 18:
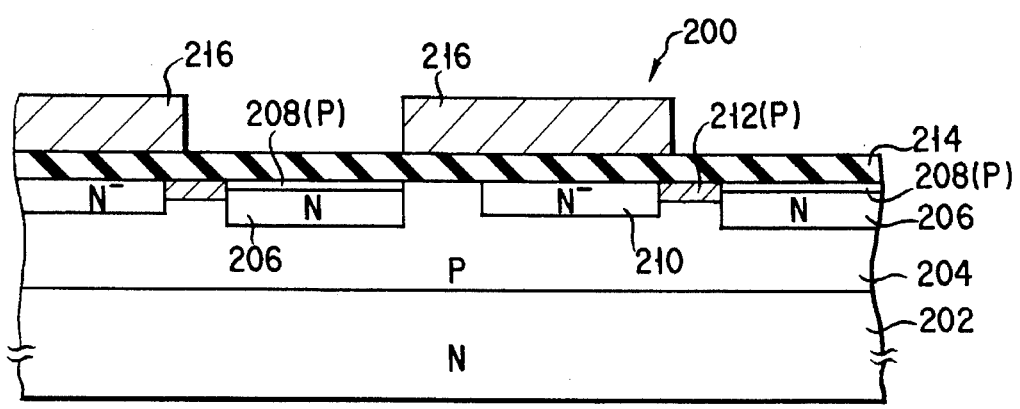
FIG. 18 is a diagram showing the cross-sectional view of the embodiment of FIG. 17 along line XVIII—XVIII.

Turning to FIG. 17, a CCD image sensor in accordance with a fourth embodiment of the invention is generally designated by numeral "200." The cross-sectional structure along line XVIII—XVIII is illustrated in FIG. 18; that along line XIV≦XIV is illustrated in FIG. 19. A substrate 202 is made of N type silicon material. A P type well region 204 is formed in the top surface section of substrate 202. PN-junction photosensing cells are arranged in well region 204 in a matrix fashion that is similar to that of the cells 14 shown in FIG. 1.

As shown in FIG. 18, N type layers 206 constituting PN-junction photodiodes are matrix-arranged in the well region 204. A P type layer 208 is formed in the upper section of each N type layer 206. Layer 208 serves to suppress or eliminate dark-current that tends to generate at the photodiode surface region. A lightly-doped N (N–) type diffusion layer 210 is positioned near P type photodiode layer 206. Layer 210 defines a buried vertical transfer channel region of image sensor 200. A P type layer 212 is formed in well region 204 to planarly surround P type photodiode layers 206. Its plan patterning shape is apparent from viewing FIG. 17. In FIG. 17, for illustration purposes only, hatching effect is added to a layer 212, which functions as an element-separator between adjacent ones of the photosensing cells. The top substrate surface where layers 204, 206, 208, 210 are formed is covered by a gate insulation film 214. Formed on this gate insulation film is an elongate conductive layers 216 that act as a vertical transfer electrode of image sensor 200. Layers 216 may be made from specific material that is low in light-transmissivity, such as metal or metal-silicide. In FIG. 17 all but one layer 216 are omitted for illustration purpose to reveal the layout of the underlying element-separation layer 212 more descriptively.

The cross-sectional view of the buried vertical transfer channel layer 210 along the vertical carrier-transfer direction is shown in FIG. 19. Additional layers 218, 220, which are same in conductivity type as each other and different in impurity density from each other, are arranged at a certain interval between adjacent ones thereof in a predetermined order along the longitudinal direction of channel layer 210. Heavily-doped N (N+) type layers 218a, 218b, 218c are formed in N– type channel layer 210 at first intervals; N type layers 220a, 220b are alternately positioned such that each is adjacent to an alternate one of N+ type layers 218. Such an arrangement facilitates that the potential differences (various depths of potential well) are regularly generated in a specific order along the carrier-transfer direction when the same voltage is applied to the layers.

With the image sensor 200, the transfer electrode 216 is formed of a single layer made from a selected conductive material of low-transmissivity. This can decrease the amount of undesirable leak light component to the vertical transfer section. The smear can thus be reduced. Furthermore, the above-mentioned functionality of transfer electrode 216 can eliminate the necessity of adding another light-shielding layer thereon, causing image sensor 200 to be simplified in structure.

The second feature of the image sensor 200 is that, since the transfer electrode 216 is formed on the gate insulation film 214, it is no longer required to provide any additional layer between the shielding layer and the transfer electrode for electrically separating them, unlike the prior art. It thus becomes possible to make image sensor 200 thinner. This feature can eliminate the necessity of forming the "eaves" portion of the transfer electrode at the cell section, which has been employed conventionally. The cell aperture ratio can be improved accordingly. This may enhance the accuracy in the micro-fabrication of cell sections, causing image sensor 200 to exhibit higher sensitivity with maintaining higher integration density.

An exemplary cross-section of the signal-carrier adder section 222 of the image sensor 200 is given in FIG. 20. This adder section is adapted to be arranged on the substrate 202 such that adder 222 has an insulated electrode 224, which is positioned between the end portions of vertical transfer electrodes 216 and the insulated electrode 226 of horizontal transfer section 228. Electrode layers 216, 224, 226 are positioned in the same level over substrate 202.

As shown in FIG. 20, the signal-carrier adder section 222 has an N type diffusion layer 230. Layer 230 is formed in well region 204. An electrode 224 covers layer 230 insulatively. Layer 230 temporarily stores therein packets of signal carriers that are sequentially transferred thereto from the vertical transfer section in response to a pulse signal being externally applied to electrode 224. The pulse signal is a clock pulse signal Φa that controls the signal-carrier adding operation. The carrier transfer and carrier addition operations for an interline image-sensing of sensor 200 may be accomplished by employing one of presently available techniques. For example, to enable of a successful transmission of signal carriers with the single-electrode configuration, it is recommendable to employ a technique known as the "VIRTUAL PHASE CCD TECHNOLOGY," by J. Hynecek, disclosed in IEDM Tech., Digest 1979 at pp. 611–614, or its slightly modified method.

Figure 21:
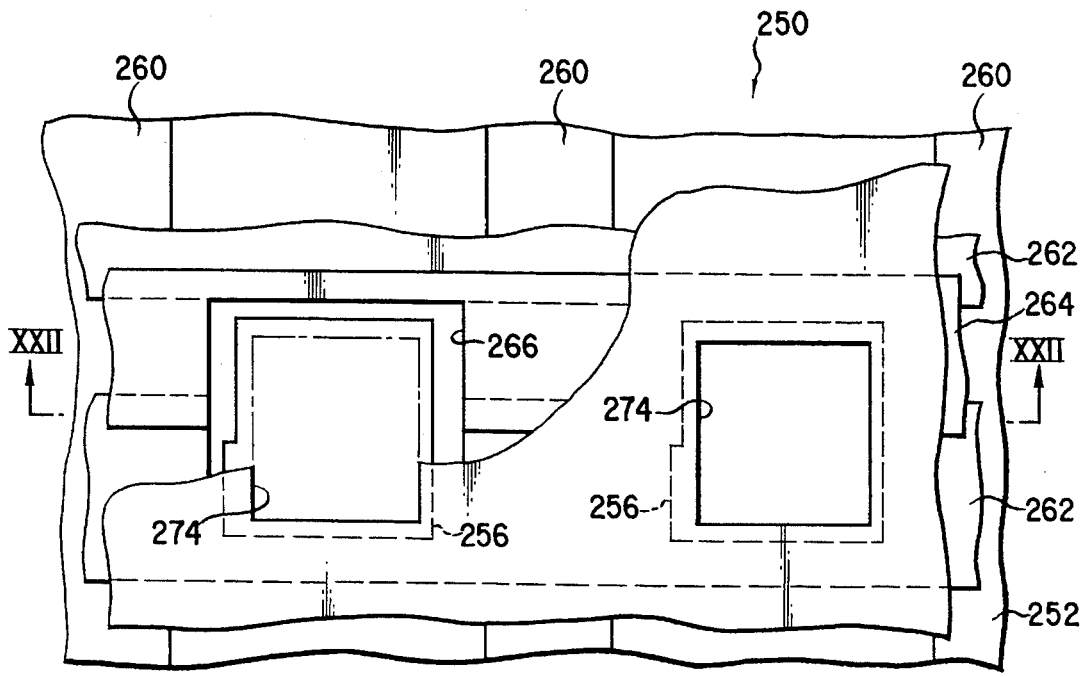
FIG. 21 is a diagram schematically the fragmentary plan view of a CCD image sensor in accordance with a still further embodiment of the present invention.
Figure 22:
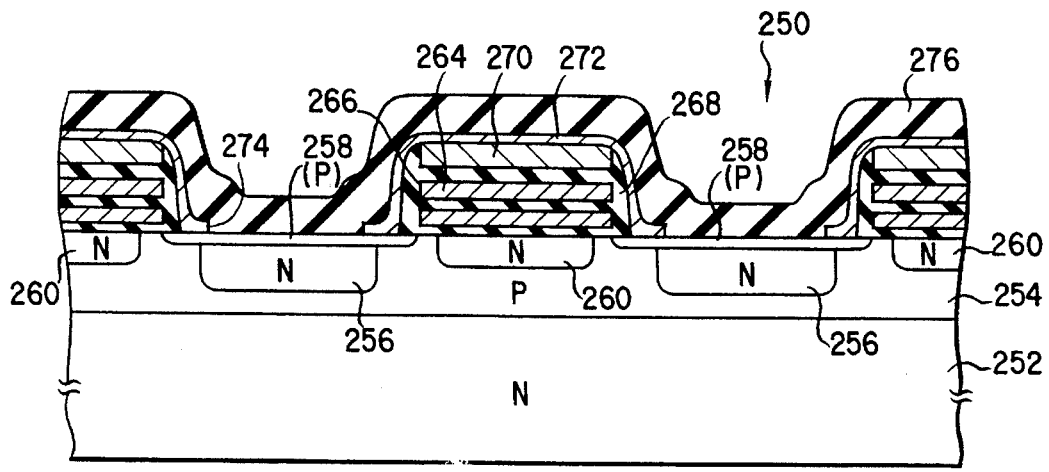
FIG. 22 is a diagram showing the cross-sectional view of the embodiment of FIG. 21 along line XXII—XXII.

Turning to FIG. 21, a CCD image sensor in accordance with a fifth embodiment of this invention is generally designated by numeral "250." Its cross-sectional structure along line XXII—XXII is shown in FIG. 22. A substrate 252 is made from N type silicon material. A P type well region 254 is arranged in the top surface of substrate 252. Well region 254 is provided with N type diffusion layers 256, which are formed at the positions of photosensitive cells to constitute PN-junction photodiodes. A P type dark-current eliminator layer 258 is in contact with the upper portions of these layers 256. Arranged between layers 256 are elongate N type layers 260 that define a vertical transfer channel region. The arrangement of photodiodes and vertical transfer channel layers is essentially same as those of the previously described embodiments.

As shown in FIG. 21, insulated transfer electrodes 262, 264 are alternately arranged over the buried transfer channel layers 260. These electrodes 262, 264 extend transverse to channel layers 260. Adjacent ones of electrodes 262, 264 partly overlap with each other at their edge portions. Electrodes 262, 264 are provided with openings 266 in the photosensitive cell areas, and electrically separated from each other by a dielectric layer 268, which covers them. As shown in FIG. 22, a first light-shielding film 270 is insulatively disposed above electrode 264. A second light-shielding film 272 is formed on film 272. Second shielding film 272 is specifically arranged so that it is adhered to the internal wall of opening 266 and that an end portion 274 thereof is in direct contact with the substrate surface. A transparent dielectric protection layer 276 overlies second film 272. Note in FIG. 21 that the illustration of first film 270 and protection layer 276 is omitted for simplification purposes only. With such an arrangement also, smear can be reduced successfully while maintaining the integration density higher due to the same principle as previously described.

The manufacture of the image sensor 250 is as follows. FIG. 23A through 23E illustrate the major cross-sectional structures cut along the vertical charge-transfer direction, which may be obtained during the manufacturing process, whereas FIG. 24A through 24E show some cross-sectional structures transverse to the vertical charge-transfer direction. First, as shown in FIG. 23A, P type well region 254 and N type diffusion layer 260 are sequentially formed in the surface section of P type substrate 252. Substrate 252 is subjected to a chemical surface treatment, whereby a gate insulation film 280 is formed on substrate 252. A polycrystalline silicon layer 262 is then deposited on gate insulation film 280 as the first transfer electrode.

Subsequently, as shown in FIG. 23B, the polycrystalline silicon layer 262 is selectively etched with a patterned resist layer (not shown) formed on layer 262 being as a mask therefor. A plurality of openings 266 are thus defined in layer 262. Then, as shown in FIG. 23C, the patterning-processed polycrystalline silicon layer 262 is subjected to a surface treatment, obtaining a dielectric layer 282 thereon. Another polycrystalline silicon layer 264 is formed on layer 282 as the second transfer electrode.

Subsequently, as shown in FIG. 23D, a similar selective-etching process to that of FIG. 23B is carried out to obtain the double-layered structure of the first and second transfer electrodes, the layout of which is shown in FIG. 21. Dielectric protection layer 276 is then deposited on the entire surface of the resultant structure.

Figure 24A:
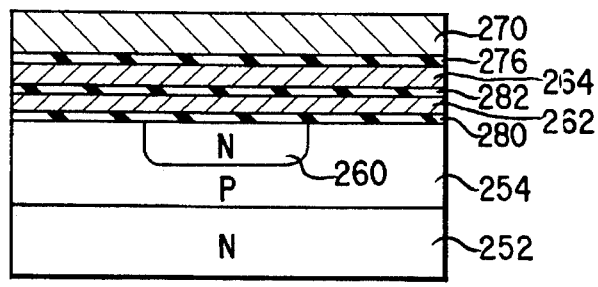
FIGS. 24A–24E illustrate, in schematic transverse cross-section, some of the major steps in the process of the CCD image sensor shown in FIGS. 21 and 22.

The manufacture continues as follows. Subsequently, as shown in FIG. 24A, high-melting-point metallic layer 270 (such as molybdenum, tungsten, or silicide material of either one) is formed to cover the structure of FIG. 23E. Layer 270 may also be made from aluminum. Note that the cross-sectional view of FIG. 24A and the following ones shown in FIGS. 24B to 24E are along a different cut-out plane (a direction transverse to the elongate carrier-transfer channel region) in the same device.

Figure 24B:
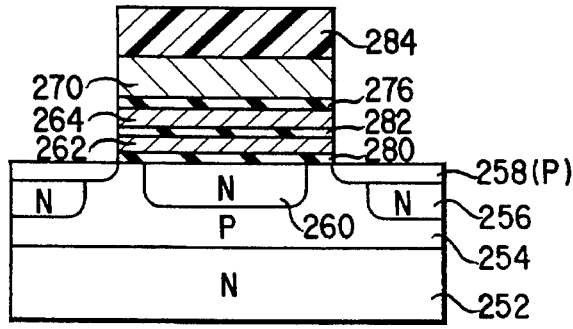
Figure 24C:
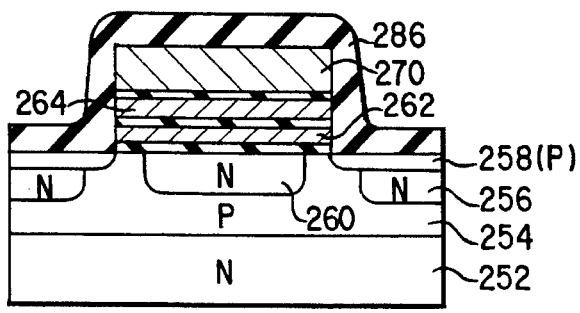

Subsequently, a resist layer 284 is deposited on the layer 270, and is then patterned. By using this resist layer as a mask, a selective etching process is performed to obtain a multi-layered structure shown in FIG. 24B, wherein the underlying layers 280, 262, 282, 264, 276, 270 were etched selectively. An N type impurity is then doped into well region 254 at cell areas thereof, thereby forming photodiode layers 256 therein. Then, a P type impurity is doped into the cell areas of well region 254, forming dark-current eliminator layer 258. Layer 258 is substantially self-aligned with the patterned layers 280, 262, 282, 264, 276, 270, as shown in FIG. 24B.

Figure 24D:
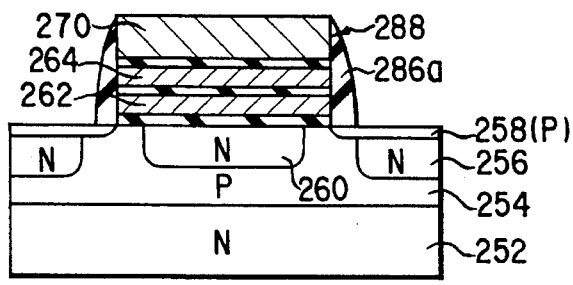

After the resist layer 284 is removed, a silicon oxide film 286 is deposited to cover the resultant structure. An isotropic etching such as RIE is then performed, causing most layer portions to be removed away, except for specific portions 286a that remain contact only with the vertical side wall of a resulting multi-layered structure 288 as shown in FIG. 24D. These layer portions 286a correspond to layers 268 in FIG. 22. This means that side-wall dielectric layers 286a can be easily formed in a self-aligned manner.

Figure 24E:
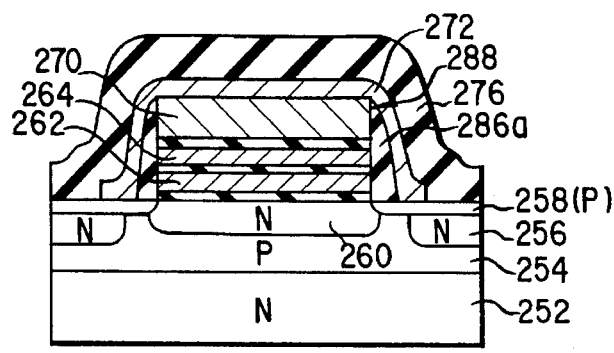

Then, an aluminum thin film is deposited on the entire surface of the resulting structure, and subjected to a patterning process, thus forming the second shielding film 272 that covers the multi-layered structure 288 with side-wall layers 286a as shown in FIG. 24E. Subsequently, dielectric protection layer 276 is deposited to entirely cover the resultant structure on substrate 252. The image sensor 250 of FIGS. 21 and 22 is now completed. With the above manufacturing method, it is possible to form side-wall dielectric layers 286a ("268" in FIG. 22) in accurate self-align manner at each cell opening. This can allow the light-shielding section to have the double-layered structure consisting of the thick film 270 and the thin film 272; therefore, any unwanted introduction of leak light component into the vertical channel region can be eliminated more successfully, causing smear to reduce toward zero. The image sense performance can thus be enhanced while maintaining the cell integration density improved.

The present invention is not limited to the above-described specific embodiments and may be practiced or embodied in still other ways without departing from the spirit or essential character thereof.

What is claimed is:

1. A semiconductor imaging device comprising:

a semiconductive substrate;

a well region in said substrate;

an array of rows and columns of photoelectric cells in said well region, each of said cells having a first impurity-doped semiconductor layer which is different in conductivity type from said well region;

a plurality of first charge-transfer sections extending along the rows of cells on said substrate and having outputs;

a second charge transfer section coupled to the outputs of the first transfer sections and extending transverse to said first transfer sections;

light-shield means overlying said first charge-transfer sections, for cutting off an internal reflection path between each cell and a corresponding one of said first charge-transfer sections, and for preventing an incident light from being introduced into said transfer channel region through the reflection path as a leak component thereto;

a second impurity-doped semiconductor layer having the same conductivity as said well region and overlapping said first impurity-doped semiconductor layer in said well region, said second impurity-doped semiconductor layer being set at a reference ground potential; and said light-shield means comprising a conductive layer having an end portion being in contact with said second impurity-doped semiconductor layer at a surface of said substrate, thereby causing said conductive layer to be potentially equivalent to or greater than said second impurity-doped semiconductor layer.

2. The device according to claim 1, wherein each of said first transfer electrode sections comprises:

a semiconductor layer neighboring to said impurity-doped semiconductor layer in said well region, and different in conductivity type from said well region; and an insulated single-layered transfer electrode overlaying said transfer channel layer.

3. A semiconductor imaging device comprising:

a semiconductive substrate;

a well region in said substrate;

an array of rows and columns of photoelectric cells in said well region, each of said cells having an impurity-doped semiconductor layer which is different in conductivity type from said well region;

a plurality of first charge-transfer sections extending along the rows of cells on said substrate and having outputs;

a second charge transfer section coupled to the outputs of the first charge-transfer sections and extending transverse to said first charge-transfer sections;

a transfer channel region included in each of said first charge-transfer sections adjacent to said impurity-doped semiconductor layer in said well region and extending in a predetermined direction in said substrate, for causing charge carriers to move through said transfer channel region;

light-shield means overlying said first charge-transfer sections, for cutting off an internal reflection path between each cell and a corresponding one of said first charge-transfer sections, and for preventing an incident light from being introduced into said transfer channel region through the reflection path as a leak component; and a dielectric region formed in each of said first charge-transfer sections, wherein said first charge-transfer sections each include at least one transfer electrode and a silicon nitride layer embedded within said dielectric region.

4. The semiconductor imaging device according to claim 3, wherein said dielectric region consists of silicon oxide material.

5. The semiconductor imaging device according to claim 3, wherein said light-shield means is a shielding layer which is formed so as to cover said dielectric region.

6. The semiconductor imaging device according to claim 3, wherein said silicon nitride layer is formed so as to be embedded within said dielectric region between said light-shield means and said at least one transfer electrode.

7. The semiconductor imaging device according to claim 3, wherein said dielectric region forms a side wall of a light reception opening of a corresponding cell.

* * * * *